Figure 1:
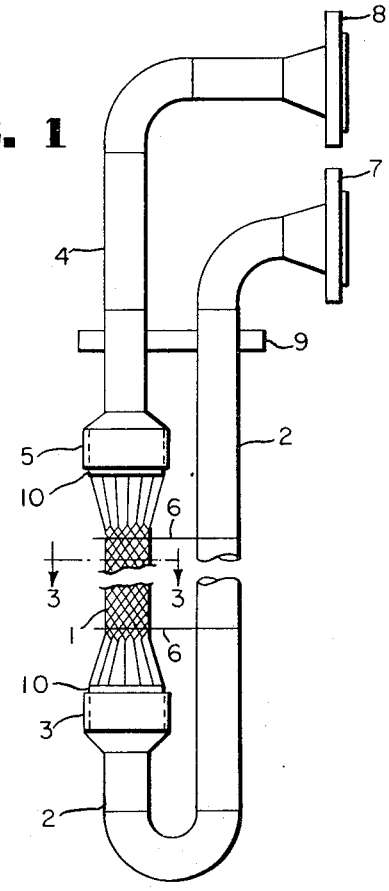
Figure 2:
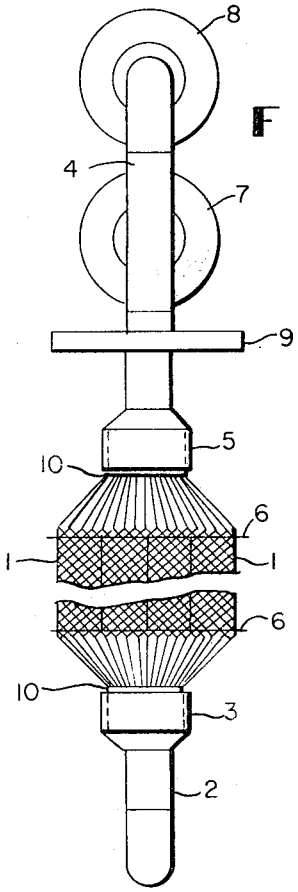
Figure 3:
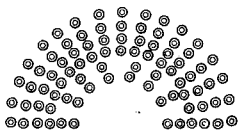
Figure 4:
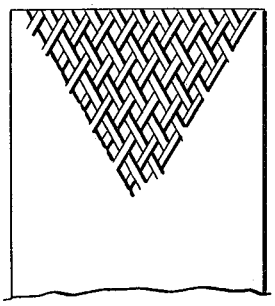
Figure 5:
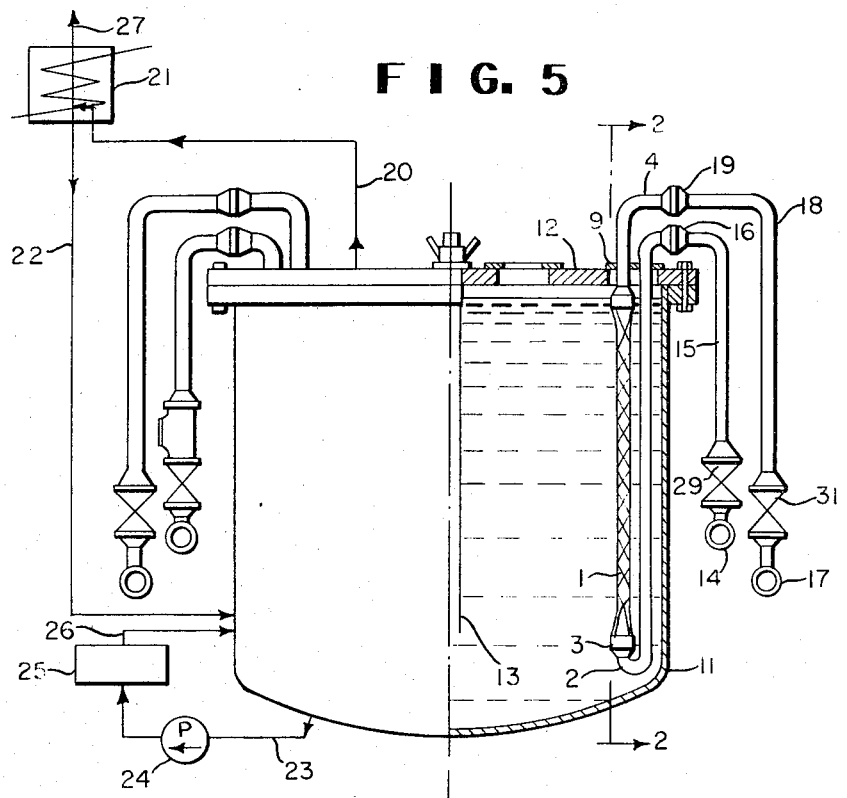
Figure 6:
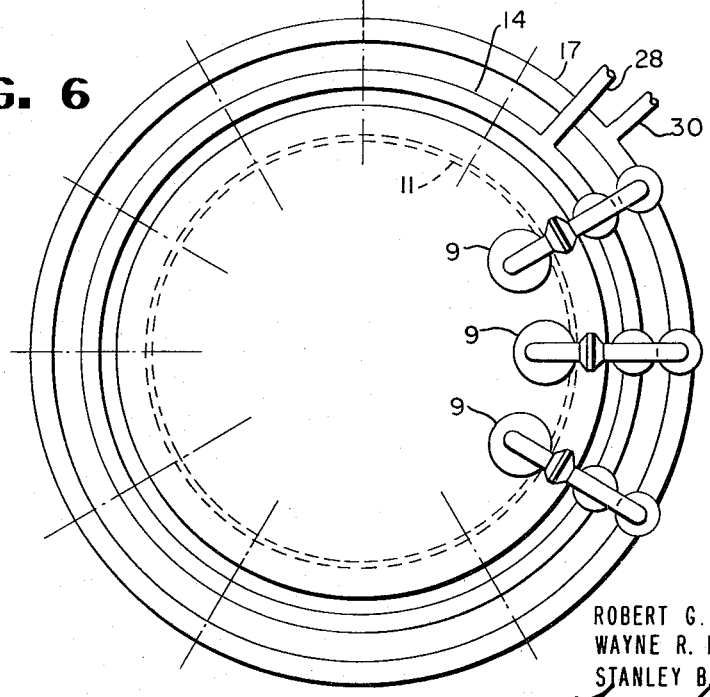

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED APRIL 28, 1970

873 O.G. 1033

T873,015

PHOTOCHEMICAL REACTOR

Robert G. Finnerty, Jr., Woodstown, N.J., and Wayne R. Hager, Newark, and Stanley B. Levy, New Castle, Del., assignors to E. I. du Pont de Nemours and Company, Wilmington, Del., a corporation of Delaware

Filed May 29, 1969, Ser. No. 828,875

Int. Cl. H01j *37/00;* G01r *31/00*

U.S. Cl. 250—43

2 Sheets Drawing. 16 Pages Specification

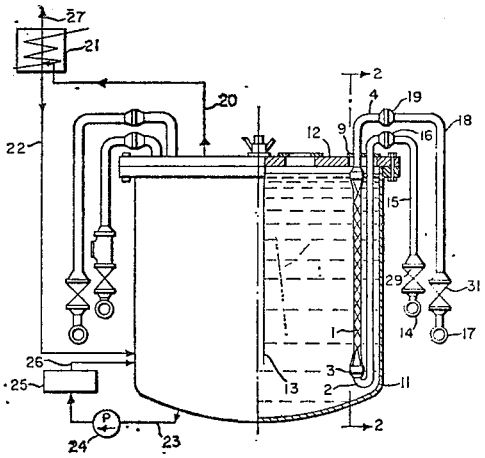

A photochemical reactor wherein a source of light energy is positioned along the longitudinal axis of a closed vessel. About the light source are situated a plurality of hollow tube reaction units each comprised of one or more tube bundles positioned so that each bundle is equidistant from and parallel to the light source. The unoccupied interior portion of the closed vessel will contain a heat transfer fluid.

Each tube bundle consists of a plurality of concentric sleeves, each sleeve being made up of interwoven hollow tubes which are spiralled about the longitudinal axis of such sleeve. The lateral portions of the tube ends of each unit are surrounded by integral tube sheets with the ends of each tube protruding at least to the outer face of said sheets and being in open communication with reducing couplers defining a headspace adjacent to said outer face. An inlet conduit and an outlet conduit extend through the wall of the vessel, the inlet conduit communicating with the reducing coupler at one end of the unit and the outlet conduit communicating with the coupler at the other end, said conduits having joining means at their other ends exterior to the vessel.

PHOTOCHEMICAL REACTOR

Filed May 29, 1969 2 Sheets-Sheet 1

INVENTORS
ROBERT G. FINNERTY, JR.
WAYNE R. HAGER
STANLEY B. LEVY
BY Francis J. Crowley
ATTORNEY

PHOTOCHEMICAL REACTOR

Filed May 29, 1969 2 Sheets-Sheet 2

INVENTORS
ROBERT G. FINNERTY, JR.
WAYNE R. HAGER
STANLEY B. LEVY
Francis J. Crowley
ATTORNEY